United States Patent [19]
Hoeld

[11] Patent Number: 5,639,680
[45] Date of Patent: Jun. 17, 1997

[54] METHOD OF MAKING ANALOG MULTIPLEXER CELL FOR MIXED DIGITAL AND ANALOG SIGNAL INPUTS

[75] Inventor: Wolfgang K. Hoeld, Moorenweis, Germany

[73] Assignee: National Semiconductor Corporation, Santa Clara, Calif.

[21] Appl. No.: 443,544

[22] Filed: May 18, 1995

Related U.S. Application Data

[63] Continuation of Ser. No. 302,308, Sep. 8, 1994.

[51] Int. Cl.$^6$ ............................................. H01L 21/8238
[52] U.S. Cl. ......................... 437/51; 437/56; 327/404
[58] Field of Search ................................ 327/404; 437/51, 437/54, 56

[56] References Cited

U.S. PATENT DOCUMENTS

| | | | |
|---|---|---|---|
| 4,985,703 | 1/1991 | Kaneyama | 341/141 |
| 4,998,101 | 3/1991 | Trumpp et al. | 340/825.91 |
| 5,276,346 | 1/1994 | Iwai et al. | 257/360 |

FOREIGN PATENT DOCUMENTS

| | | | |
|---|---|---|---|
| 59-61315 | 4/1984 | Japan | 327/404 |
| 62-43211 | 2/1987 | Japan | 327/404 |

OTHER PUBLICATIONS

S. Wolf, "Silicon Processing for the VLSI Era" vol. II, pp. 376–383, 387–389, 416–419 Jun. 1990.

Primary Examiner—Charles L. Bowers, Jr.
Assistant Examiner—Leon Radomsky
Attorney, Agent, or Firm—Skjerven, Morrill, MacPherson, Franklin & Friel; Norman R. Klivans

[57] ABSTRACT

An input cell circuit for an integrated circuit for use in a mixed signal mode where an input pin may receive either digital or analog signals. The circuit solves the problem where several such pins are used in a mixed signal mode and share a common internal bus. Such input signals will cause erratic values on the common analog bus, if any given input pin is used as a digital input signal and the voltage on that input pin exceeds the supply voltage by the base-emitter voltage of the parasitic transistor in the P-channel transistor in a pass gate in the associated input cell. This problem is solved by adding a second P-channel transistor to the pass gate and also adding an N-channel transistor connected to a node between the two P-channel transistors, as well as adding an input resistor. The second N-channel transistor is on while the other three transistors are off and exhibits a drain/source on-resistance such that the lateral and vertical bipolar parasitic transistors formed by the second P-channel transistor will not turn on and there is no leakage current between the input of the cell and the output of the cell.

4 Claims, 4 Drawing Sheets

METHOD OF MAKING ANALOG MULTIPLEXER CELL FOR MIXED DIGITAL AND ANALOG SIGNAL INPUTS

This application is a continuation of application Ser. No. 08/302,308, filed Sep. 8, 1994.

BACKGROUND OF THE INVENTION

1. Field of the Invention

This invention pertains to integrated circuits and more specifically to an analog multiplexer cell for accepting both analog and digital input signals to a MOS integrated circuit.

2. Description of the Prior Art

Certain integrated circuits fabricated by the well known MOS processes are adapted to accepting both analog and digital input signals on a single line, i.e., to a particular input pin. In the prior art this pin which may accept analog or digital input signals is connected to a conventional analog multiplexer cell (pass gate). When several of these cells share a common analog bus, this causes erratic values (signal levels) on that bus if any given input pin is used as a digital input and the voltage applied to the input pin exceeds the supply voltage $V_{CC}$ by voltage $V_{BE}$, where $V_{BE}$ refers to the base-emitter voltage of the lateral PNP (bipolar) parasitic transistor formed by the P-channel MOS transistor in the analog pass gate. Additionally, pin-to-pin leakage can occur, caused by the lateral PNP parasitic transistor in one of the adjacent multiplexer cells which turns on when the voltage on the bus exceeds the value $V_{CC}+V_{BE2}$, where $V_{BE2}$ refers to the base-emitter voltage of the lateral PNP parasitic transistor formed by the P-channel MOS transistor in the adjacent cell.

Therefore these prior art problems occur in an input cell to an integrated circuit which can be used in a mixed signal mode where one or several pins (terminals) are used as digital signal input pins and one or several other input pins are used as analog signal input pins and share a common internal bus. If any of the digital input pins have voltages applied which are higher than $V_{CC}+V_{BE}$ of the input cell circuitry, these problems occur. This condition is often found for instance in the automotive electronics environment where it is a common practice to connect digital signal inputs to the battery voltage, typically about 15 volts, through a series (current limiting) resistor.

FIG. 1 shows a prior art circuit having the above-described drawbacks. Input A is a signal applied to input pin 12 of a first cell 10. A second signal input B is applied to a second input pin 14 of a second cell 20. Cell 10 includes a digital mode selection NAND gate 18, to which one input terminal of which is applied a Digital Select signal, and the second input terminal of which is connected to pin 12. The analog switch portion of first cell 10 includes a pass gate including an N-channel (MOSFET) transistor N1 connected to a P- channel (MOSFET) transistor P1. The gate terminals respectively of transistor N1 and transistor P1 are connected to an Analog Select signal and the inverse of the Analog Signal Select.

Also inherently present in the analog switch portion of the first cell 10 is a parasitic lateral PNP (bipolar) transistor QP1 having emitter E, collector C, and base B. The base-emitter voltage of QP1 is referred to as $V_{BE1}$. The base of transistor QP1 is connected to the supply voltage $V_{CC}$. The detail of the second cell 20 is identical to that of the first cell 10 and is not shown except for another parasitic biopolar transistor QP2 shown as having the base emitter voltage $V_{BE2}$. The base B of parasitic transistor QP2 is connected to the supply voltage $V_{CC}$. The output signal for the pass gate including transistors N1 and P1 is provided on line 22 to a conventional analog circuit block 28 which is the analog portion of the integrated circuit. Similarly, the output signal of the second cell 20 is provided on output line 24 which is connected via a common bus 26 to line 22. Thus line 26 is the common internal bus referred to above. The above-described problem arises when input signal A or input signal B exceed the supply voltage of $V_{CC}$ by the amount $V_{BE}$ for any particular cell. The pin-to-pin leakage referred to above is between pin 12 and pin 14.

In FIG. 1 it is to be understood that the lateral parasitic PNP (bipolar) transistor, e.g., QP1, in each cell causes these problems. The vertical parasitic PNP transistor in each cell actually reduces the magnitude of this problem; however the current handling capability of the vertical PNP transistors is substantially reduced by the relatively large substrate resistance and hence is not sufficient to eliminate the problem.

If the voltage on any one of the input pins, i.e. pin 12, exceeds $V_{CC}$, the first (conventional) input diode $D_1$ is forward biased. In addition, the base-emitter junction of lateral PNP transistor QP1 is also forward biased because the base B of transistor $QP_1$ is connected to the supply voltage $V_{CC}$. Thus, transistor QP1 turns on and the voltage on the output line 22 of the pass gate is the voltage of pin 12 minus the collector-emitter voltage ($V_{CE}$) of transistor QP1. This results in a base current in the similar lateral parasitic bipolar transistor QP2 of adjacent cell 20.

Since in each cell the P-channel (MOSFET) transistor P1 is fully symmetrical in terms of its drain/source configuration, the terminal of the parasitic transistor QP2 in cell 20 connected to the output line 24 of cell 20 (nominally the collector) assumes the function of the emitter (terminal E) of transistor QP2, as illustrated in FIG. 1. Thus, the parasitic transistor emitter and collector structures are symmetrical, and so the emitter E of QP2 is connected to the output terminal of cell 20. In this case, transistor QP2 of cell 20 turns on. Thus, undesirably a current path is created from the input pin 12 of cell 10 to the input pin 14 of cell 20.

The other above-described problem exists when the signal input B to cell 20 is held low by a pull down resistor (not shown) of a connected external circuit. Then the current from the input signal A to cell 20 generates a voltage drop across that pull down resistor (not shown) which appears on input pin 14 of cell 20. If this voltage drop exceeds the threshold of the digital input buffer gate 18, an erroneous digital value may be read from the input pin 14 of cell 20.

SUMMARY OF THE INVENTION

In accordance with the invention, the pass gate of the analog switch of the prior art multiplexer cell is modified by the addition of a second P-channel transistor serially connected to the first P-channel transistor, and a second N-channel transistor connected to a node between the two P-channel transistors and to ground. Additionally, an input resistor is provided between the input pin and the input terminal of the pass gate. The two P-channel transistors are located in separate N-wells in the integrated circuit substrate. This advantageously solves the problem of pin-to-pin leakage which in the prior art leads to an improper logic value being read if the pin being read is held low by an external stage whose impedance is large enough to cause the voltage to drop greater than the input voltage of the pin being read.

The added N-channel transistor in the cell is on when the two P-channel transistors and the first N-channel transistor are off, in the digital mode of the cell. Thus, the lateral and vertical PNP transistors which are parasitically formed by the second P-channel transistor will not turn on and there is no leakage current from the input to the output of the pass gate. In the analog mode of the cell, the two P-channel transistors as well as the first N-channel transistor are on and the second N-channel transistor is off, allowing the cell to function as a conventional analog multiplexer switch. The added input resistor limits the current into the lateral parasitic transistor formed by the first P-channel transistor and therefore limits the collector current of this first parasitic transistor.

The added N-channel transistor disables the current path from the input terminal of the pass gate to the output terminal of the pass gate by keeping turned off the second lateral parasitic transistor formed by the second P-channel transistor in the pass gate. Thus, the added N-channel transistor provides a low impedance path to ground for the collector current of the first parasitic transistor, which deprives the second parasitic transistor of its base current, thereby turning off the second parasitic transistor.

DETAILED DESCRIPTION OF THE INVENTION

Figure 1:
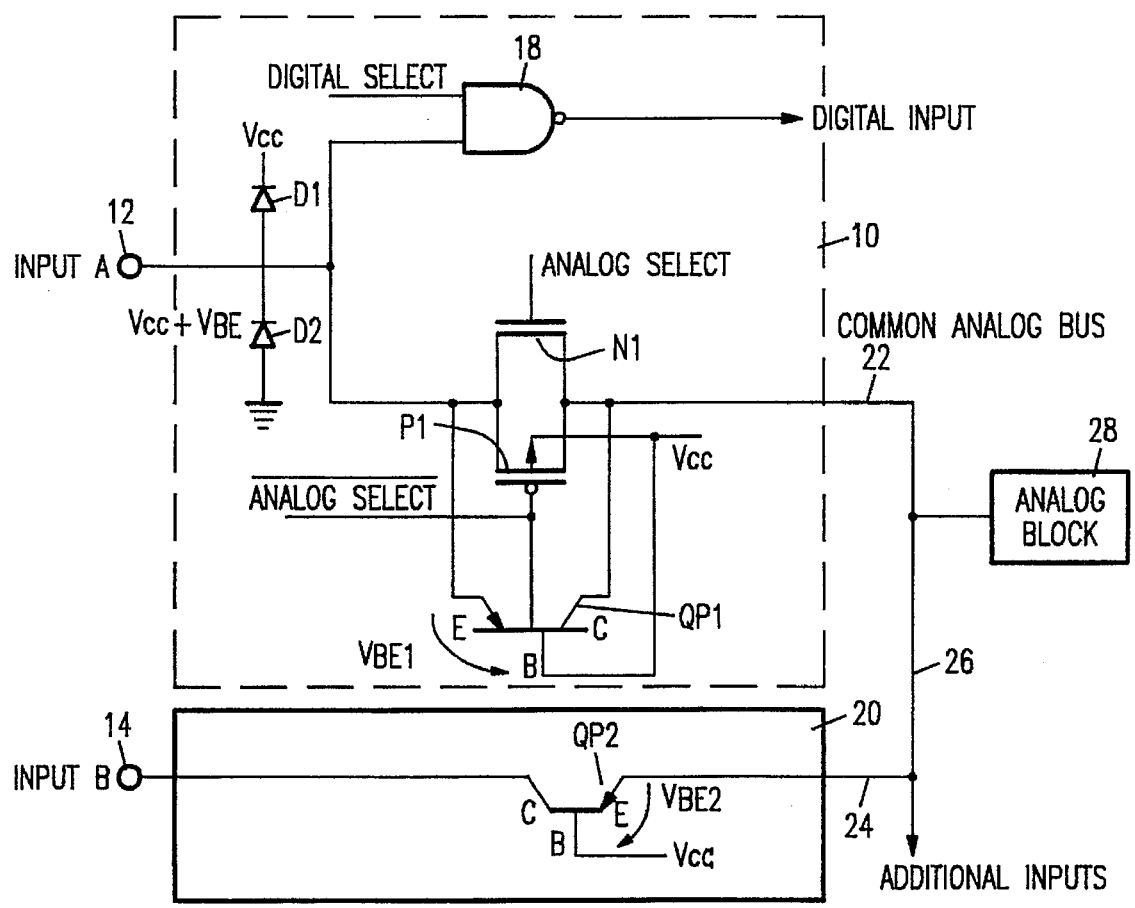
FIG. 1 shows a schematic of a prior art input circuit for a MOS integrated circuit.
Figure 2:
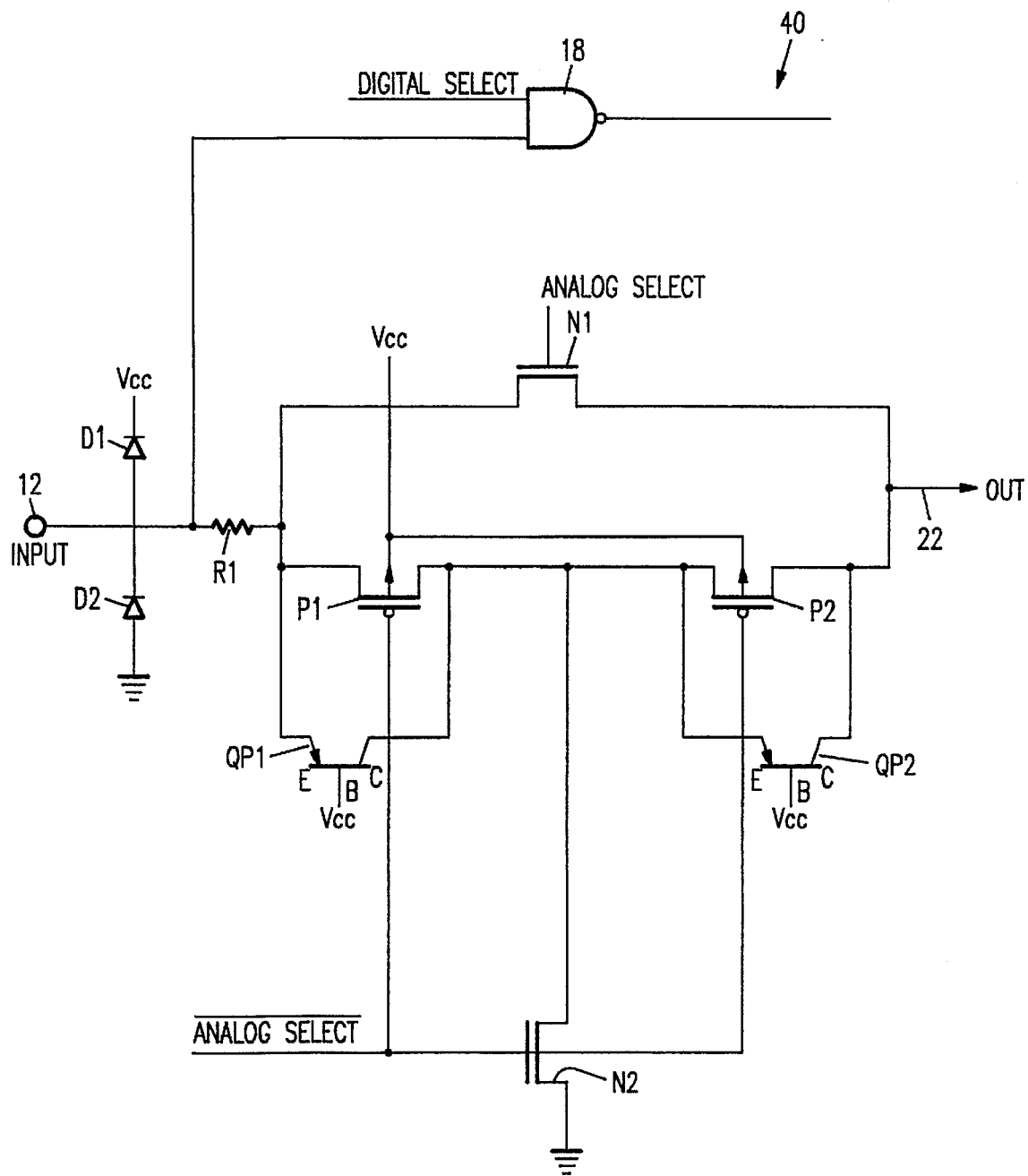
FIG. 2 shows a schematic of a multiplexer cell for mixed analog and digital signal inputs in accordance with the present invention.

FIG. 2 shows schematically a circuit of a multiplexer cell 40 in accordance with the present invention. Certain elements having identical reference symbols to those of FIG. 1 are intended to be similar or identical. Comparison of FIG. 1 to FIG. 2 shows that the differences are the addition of (1) resistor R1, (2) the second P-channel transistor P2, and (3) the second N-channel transistor N2. The second (adjacent) cell is not shown in FIG. 2 but is identical to cell 40. The output bus 26 and analog block 28 are also not shown in FIG. 2 but are identical to those of FIG. 1.

This circuit solves the above-described problem in the prior art of pin-to-pin leakage leading to a wrong logic value being read if the pin being read is held low by a connected external stage whose impedance is large enough to cause a voltage drop larger than $V_{1H}$, where $V_{1H}$ is the voltage of the pin being read. This condition is described by the following equation:

$$V_{1H} < R_{PD} * I_{Leak}$$

In this equation $R_{PD}$ is the pull down resistance of the external stage which is driving the pin being read. In this case, this is pin 12. $I_{Leak}$ is the pin-to-pin leakage current. The cell 40 shown in FIG. 2 prevents this undesirable condition as follows. If the voltage at input pin 12 exceeds $V_{CC} + V_{BEQP1}$, where $V_{BEQP1}$ is the base-emitter voltage of parasitic transistor QP1, the lateral and vertical PNP parasitic transistors formed by P-channel transistor P1 will turn on. (Note that the vertical PNP transistor is not shown here). The resulting current is limited by input resistor R1 which limits the collector current of transistor QP1 as well. The object is to limit the voltage on the collector C of the second parasitic transistor QP2 to a value less than that of $V_{CC} + V_{BEQP2}$.

This is accomplished by the second N-channel transistor N2 which is a MOSFET having a drain/source terminal connected to a node connected between P-channel transistors P1 and P2. In the digital mode of operation, N-channel transistor N2 is on when P-channel transistors P1 and P2 and N-channel transistor N1 are off, because the Analog Select signal which controls N-channel transistor N1 and P-channel transistors P1 and P2 is the inverse of the $\overline{\text{Analog Signal}}$ signal controlling the second N-channel transistor N2. N-channel transistor N2 is such that it exhibits source-drain on resistance ($R_{DSON}$) which meets the following criteria:

$$R_{DSON}(N2) * I_{CQP1} < V_{CC} + V_{BEQP1}$$

In this equation $I_{CQP1}$ is the collector current of the lateral PNP transistor QP1.

Therefore, the lateral and vertical parasitic PNP transistors formed by P-channel transistor P2 do not turn on and there is no leakage current from the input pin 12 to the output terminal 22 of cell 40. In the analog mode, P-channel transistors P1 and P2 as well as N-channel transistor N1 are on and the second N-channel transistor N2 is off, allowing cell 40 to function as a conventional analog switch.

Further in regard to the operation of this circuit, the current path between the input pin 12 and the output terminal 22 is disabled when the input signal has a voltage level higher than that of $V_{CC}$ by an amount exceeding $V_{BEQP1}$. (That is, the above criteria for $R_{DSON}$ (N2) is met). This accomplished by the input resistor R1 which limits the current into the lateral parasitic PNP transistor QP1 and therefore limits the collector current at collector terminal C of parasitic lateral transistor QP1.

The second stage of the pass gate of cell 40 includes the second P-channel transistor P2 and its parasitic bipolar transistor QP2. In order to keep the current path from the input terminal 12 to the output terminal 22 disabled (non-conductive), transistor QP2 must be kept off. This is accomplished by the second N-channel transistor N2 which is turned on when the switch is off, due to the Analog Select control signal.

The second N-channel transistor N2 provides a low impedance path to ground for the collector terminal C of transistor QP1, which turns off the base current to base terminal B of transistor QP2.

In accordance with the invention, the two P-channel transistors P1 and P2 are fabricated in separate N wells as described in further detail below.

Figure 3A:
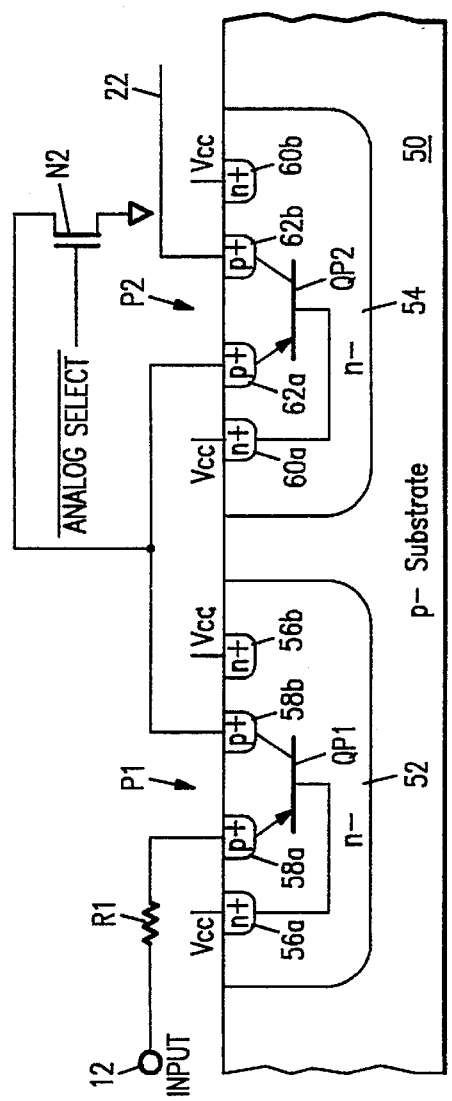
FIG. 3A shows a partial cross-section of an integrated circuit for the circuit of FIG. 2.
Figure 3B:
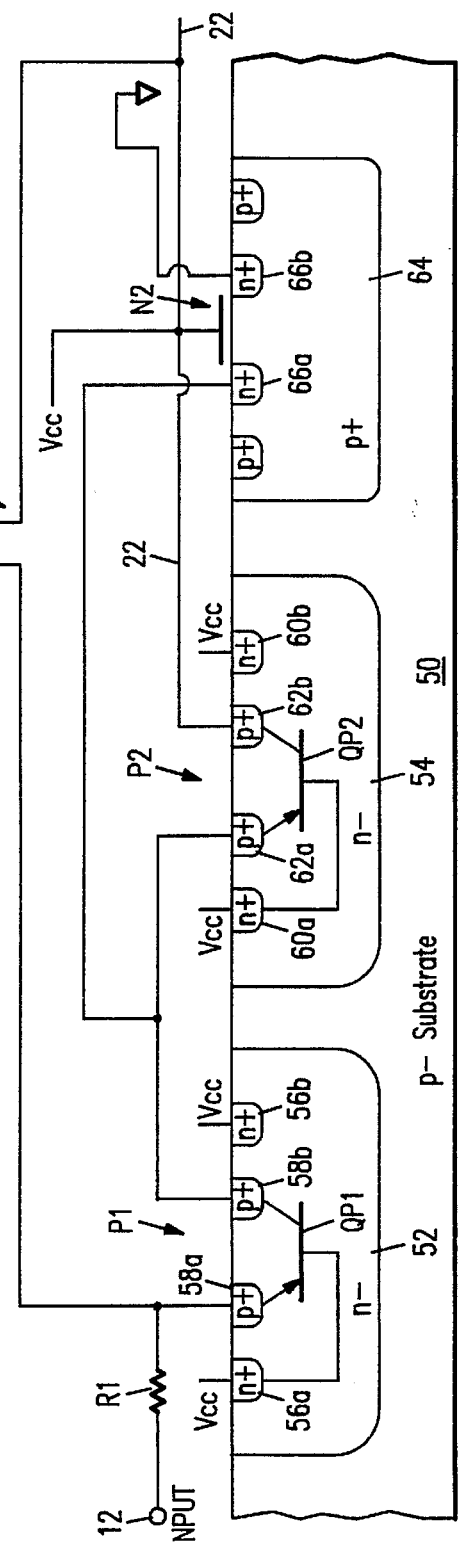
FIG. 3B shows a partial cross section of an integrated circuit for the circuit of FIG. 2 including in cross section the second N-channel transistor.

FIG. 3A shows a cross-section of a portion of an integrated circuit (I.C.) showing a portion of the circuit of FIG. 2. For simplicity, a number of the conventional elements of FIG. 2 have been omitted from FIG. 3A. Transistor N2 conventionally includes two spaced apart N+ doped regions which are the source/drain regions and at least one P+ doped body region all formed in a P– doped epitaxial layer on a substrate, and an overlying gate electrode. Transistor N1 has an identical structure. Additionally, FIG. 3A is a combination of an I.C. cross-section and a schematic since the second N-channel transistor N2 is shown only schematically. It is to be understood that transistor N2 is conventionally fabricated in another portion of the epitaxial layer 50 of FIG. 3A as shown in FIG. 3B. Also, resistor R1 is a conventional integrated circuit structure not shown in cross-section in FIGS. 3A, 3B.

FIG. 3B shows the same structures as in FIG. 3A also showing transistor N2 in cross section. Transistor N2 in the P-well 64 includes N doped regions 66a, 66b.

In FIGS. 3A, 3B the P-doped epitaxial layer 50 has formed in it two N- doped wells 52 and 54. The doped portions of the first P-channel transistor P1 are formed in well 52; these include the N+ doped body contacts 56a and 56b and the P+ doped source/drain regions 58a and 58b. (The conventional gate of transistor P1 is not shown for simplicity). The parasitic lateral bipolar transistor QP1 is depicted only schematically in FIGS. 3A, 3B.

Similarly, the second P-channel transistor P2 is formed in N- doped well 54 and includes two body contact regions 60a, 60b of transistor P2 which are N+ doped and two P+ doped source/drain regions 62a and 62b. The body contact regions 60a and 60b which are N+ doped and in N- well 54 are connected to the voltage source $V_{CC}$. Fabrication of the transistor structure of FIG. 3 is conventional and hence is not described here in any further detail. The doping levels are conventional for a MOS transistor fabrication process.

Figure 4:
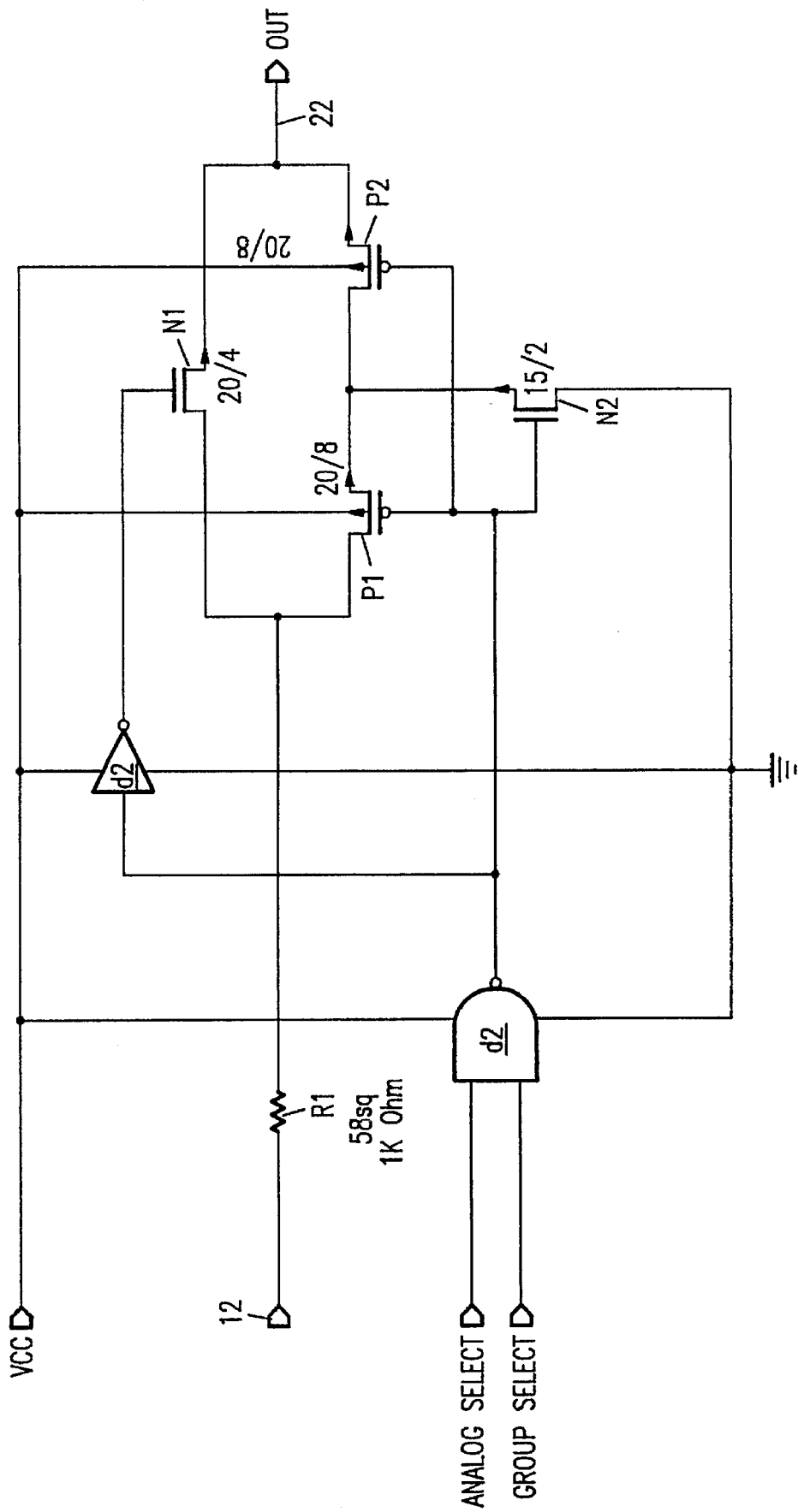
FIG. 4 shows a schematic of a multiplexer cell in accordance with the invention, with additional detail over the circuit of FIG. 2.

FIG. 4 shows a more detailed schematic of the circuit of FIG. 2. Certain elements have been omitted from FIG. 4 for simplicity, i.e. the digital select gate 18, and the input diodes D1 and D2. (The PNP transistors QP1 and QP2 are not shown since they are parasitic).

Additional elements shown in FIG. 4 are, first the invertor d2 which allows provision of the inverse of the Analog Select signal to the gate terminal of N-channel transistor N1. Also shown in FIG. 4 is the input resistor R1 which in this embodiment has a 1K ohm value provided by a 58 square size integrated circuit resistor which is formed conventionally.

Also shown numerically in FIG. 4 are the relative sizes of each of the four transistors N1, N2, P1, and P2. These sites are the gate size in microns, with the first numeral in each pair of numerals being the gate width and the second number being the gate length. It is to be understood that these sizes are illustrative and not limiting. Also shown is an additional element; this is the input NAND select gate d2. Gate d2 has two input signals which are the Analog Select signal of FIG. 2 and a Group Select signal. The Group Select signal selects particular groups of pins on the IC, is for the case where the integrated circuit has a large number of pins and it is desired only to select certain pins for the digital/analog input selection.

In one embodiment of the circuit of FIG. 4, in addition to the structure of FIG. 3, particular transistor termination structures are also formed. These termination structures are a set of N+ doped and P+ doped guard rings surrounding the P-channel transistors P1 and P2. Additionally, a set of P+ doped and N+ doped guard rings are formed surrounding the N-channel transistors N1 and N2. Also, an additional set of P+ and N+ guard rings are formed around all of the transistors N1, N2, P1 and P2. These various sets of guard rings provide the function of latch up protection.

It is well known in the art that guard rings are diffusions tied to the power supply ($V_{CC}$) and surrounding the active transistors for the purpose of collecting stray charge and providing low impedance paths to hold parasitic bipolar transistors in the off state. Double guard rings (N+ and P+ doped) are often used therefore to provide latchup protection.

The above description is illustrative and not limiting; further modifications will be apparent to one skilled in the art in light of this disclosure, and are intended to encompassed by the appended claims.

I claim:

1. A method of making an input circuit for an integrated circuit, comprising the steps of:

providing a semiconductor substrate having a first conductivity type;

forming first and second spaced-apart wells in said substrate, each well having a second conductivity type;

forming a third well spaced apart from said first and second wells in said substrate, said third well having said first conductivity type;

forming a plurality of doped regions in each of said first, second, and third wells, each of said wells including at least two doped regions of said first conductivity type and at least two doped regions of said second conductivity type;

forming a resistive region on a surface of said substrate;

forming a conductive gate electrode overlying each of said first, second and third wells;

connecting an input terminal of said integrated circuit to said resistive region;

connecting said resistive region to one of the doped regions having said first conductivity type in said first well, and connecting another of the doped regions of said first conductivity type in said first well to one of the doped regions of said first conductivity type in said second well, and to one of said doped regions of said second conductivity type in said third well;

connecting another of the doped regions of said second conductivity type in said third well to a voltage reference, thereby there being a first, second, and third field effect transistor in respectively said first, second, and third wells; and providing a fourth field effect transistor having a first current handling terminal connected to said resistive region and a second current handling terminal connected to another one of the doped regions of said first conductivity type in said second well.

2. The method of claim 1, further comprising the step of connecting one of the doped regions having said second conductivity type in each of said first and second wells to a voltage potential.

3. The method of claim 1, wherein said first conductivity type is P and second conductivity type is N.

4. The method of claim 1, wherein said two doped regions of said second conductivity type in said first and second wells are each more heavily doped than are said first and second wells.

* * * * *

UNITED STATES PATENT AND TRADEMARK OFFICE
CERTIFICATE OF CORRECTION

PATENT NO. : 5,639,680
DATED : June 17, 1997
INVENTOR(S) : Hoeld, Wolfgang K.

It is certified that error appears in the above-identified patent and that said Letters Patent is hereby corrected as shown below:

At column 1, line 58, delete "signal select" and substitute --Select Signal--.

At column 5, line 22, delete "Fig. 3" and substitute --Figs. 3A and 3B--.

Signed and Sealed this

Third Day of November, 1998

Attest:

Attesting Officer

BRUCE LEHMAN
Commissioner of Patents and Trademarks